(12) United States Patent
Sexton

(10) Patent No.: US 10,028,539 B2
(45) Date of Patent: Jul. 24, 2018

(54) GARMENT WITH ELECTROMAGNETIC RADIATION SHIELDED POCKET

(71) Applicant: Lori Sexton, Rahway, NJ (US)

(72) Inventor: Lori Sexton, Rahway, NJ (US)

(73) Assignee: Lori Sexton, Rahway, NJ (US)

( * ) Notice: Subject to any disclaimer, the term of this patent is extended or adjusted under 35 U.S.C. 154(b) by 0 days.

(21) Appl. No.: 14/840,097

(22) Filed: Aug. 31, 2015

(65) Prior Publication Data

US 2016/0058079 A1    Mar. 3, 2016

Related U.S. Application Data

(60) Provisional application No. 62/045,033, filed on Sep. 3, 2014.

(51) Int. Cl.
*A41C 3/00* (2006.01)
*H05K 9/00* (2006.01)
*A41D 27/20* (2006.01)

(52) U.S. Cl.
CPC .......... *A41C 3/0035* (2013.01); *H05K 9/009* (2013.01); *A41D 27/205* (2013.01)

(58) Field of Classification Search
CPC ............................... A41C 3/00; A41C 3/0035
USPC ............. 2/455, 463, 110, 113, 118–120, 259
See application file for complete search history.

(56) References Cited

U.S. PATENT DOCUMENTS

| | | | |
|---|---|---|---|
| 2,492,862 A * | 12/1949 | Harvey | A41C 3/0035 150/101 |
| 2,503,847 A * | 4/1950 | Shanahan | A41C 3/0035 224/638 |
| 2,764,759 A * | 10/1956 | Gazelle | A41C 3/0035 450/38 |
| 3,518,998 A * | 7/1970 | Barg | A41C 3/0035 450/89 |
| 5,067,178 A * | 11/1991 | Katchka | A41B 9/001 2/247 |
| 5,073,984 A | 12/1991 | Tone et al. | |
| 5,103,504 A | 4/1992 | Dordevic | |
| 5,518,798 A * | 5/1996 | Riedel | A41D 7/00 2/67 |
| 5,882,242 A | 3/1999 | Hardy | |

(Continued)

OTHER PUBLICATIONS http://www.lessemf.com/swissshield.html (Accessed on Aug. 1, 2014).

*Primary Examiner* — Shaun R Hurley
*Assistant Examiner* — Bao-Thieu L Nguyen
(74) *Attorney, Agent, or Firm* — Gearhart Law LLC

(57) ABSTRACT

A garment that shields a wearer from electromagnetic radiation may generally have a length of fabric forming the garment. The wearable garment may be virtually any garment such as a brassiere, camisole, shirt, pants, leggings, and the like. The garment is preferably made of at least a first fabric and a second fabric, where the first fabric is a non-metalized fabric and the second fabric being a metalized fabric. The metalized fabric, in some embodiments, is a metal plated fabric having one or more electrically conductive metals disposed thereon. The metalized fabric is used to form at least one pocket of the garment. Electronics and other devices can be placed and stored in the metalized pocket thereby shielding the wearer from electromagnetic radiation emitted by the electronic or similarly situated device.

9 Claims, 5 Drawing Sheets

(56) References Cited

U.S. PATENT DOCUMENTS

| | | | | |
|---|---|---|---|---|
| 6,176,761 B1* | 1/2001 | Underhill | A41C 3/0014 | 450/1 |
| 6,786,798 B1* | 9/2004 | Gendel | A41C 3/02 | 450/1 |
| 7,753,759 B2* | 7/2010 | Pintor | A41C 3/0035 | 450/54 |
| 8,434,169 B2 | 5/2013 | Maner | | |
| 8,484,763 B1 | 7/2013 | Lucas | | |
| 8,597,071 B2* | 12/2013 | Shweky | A41C 3/0035 | 2/247 |
| 8,597,072 B1* | 12/2013 | Lucas | A41C 3/0035 | 2/247 |
| 8,771,036 B2* | 7/2014 | Gentry | A41C 3/0035 | 2/247 |
| 8,801,681 B2* | 8/2014 | Flick | A61F 13/00063 | 424/443 |
| 9,289,016 B1* | 3/2016 | Goff | A41C 3/12 | |
| 9,295,288 B1* | 3/2016 | Goff | A41C 3/0035 | |
| 2005/0075047 A1* | 4/2005 | Zagame | A41C 3/0035 | 450/38 |
| 2007/0298684 A1* | 12/2007 | Spagna | A41C 3/0035 | 450/89 |
| 2009/0209173 A1* | 8/2009 | Arledge | A41C 3/0035 | 450/39 |
| 2011/0124267 A1* | 5/2011 | Op't Hof | A41B 9/06 | 450/33 |
| 2011/0225700 A1* | 9/2011 | Kogut | A41B 9/001 | 2/113 |
| 2011/0244758 A1* | 10/2011 | Boatright | A41C 3/0035 | 450/89 |
| 2012/0064799 A1* | 3/2012 | Rivers | A41C 3/0035 | 450/86 |
| 2012/0304357 A1 | 12/2012 | Highfield | | |
| 2013/0248064 A1* | 9/2013 | Dockman | A45C 1/04 | 150/134 |
| 2013/0281795 A1* | 10/2013 | Varadan | A61B 5/02055 | 600/301 |
| 2013/0281815 A1* | 10/2013 | Varadan | A61B 5/04085 | 600/388 |
| 2014/0353201 A1* | 12/2014 | Molineux | B65D 33/00 | 206/524.3 |
| 2015/0296895 A1 | 10/2015 | Muir | | |
| 2015/0335078 A1* | 11/2015 | Zhang | A41C 3/0064 | 450/52 |
| 2016/0206013 A1* | 7/2016 | Marshall | A41C 3/005 | |
| 2016/0374608 A1* | 12/2016 | Dugan | A61B 5/6831 | 600/301 |

\* cited by examiner

GARMENT WITH ELECTROMAGNETIC RADIATION SHIELDED POCKET

CLAIM OF PRIORITY

This application claims priority to U.S. Application Ser. No. 62/045,033 filed on Sep. 3, 2014, the contents of which are herein incorporated by reference in its entirety.

FIELD OF THE EMBODIMENTS

This field of the invention and its embodiments relate to a number of garments that have pockets to shield the wearer from electromagnetic radiation, such as shirts, pants, brassieres and other undergarments, slips, and the like. In particular, the field relates to garments with pockets that prevent or limit a wearer's exposure from electromagnetic radiation generated by electronic devices stored within the pockets.

BACKGROUND OF THE EMBODIMENTS

Electromagnetic radiation (EM radiation or EMR), is a naturally occurring property of electromagnetism. The electromagnetic spectrum is comprised of various types of electromagnetic radiation which includes visible and non-visible light. Some types of electromagnetic radiation are more harmful than others to biological tissues. The effects of electromagnetic radiation upon these living cells is influenced by the power and frequency of the source of the radiation. Currently, the World Health Organization (WHO) classifies some forms of electromagnetic radiation as a group 2b carcinogen.

The proliferation of cellular telephones has garnered much interest as these cellular telephones emit electromagnetic radiation in the microwave range of the electromagnetic spectrum. Thus, a number of scientific studies have begun to examine the thermal, non-thermal, absorption, and various other effects from prolonged exposure to such radiation. In theory, children/young persons have the potential to be at a greater risk than adults for developing cancers from cell phones. Their nervous system and other bodily systems are still developing and therefore more vulnerable to factors that may cause cancer. For example, their heads are smaller than those of adults and therefore have a greater proportional exposure to the field of radiofrequency radiation that is emitted by cell phones. Further, children have the potential of accumulating more years of cell phone exposure than adults.

Recently, it has been reported in the media that young women have been stricken with breast cancer after apparently storing their cellphone within their brassiere for hours on end every day. Storing a cellphone in one's brassiere frees up their hand and pockets, if present, on other clothing for items such as keys which may not be very comfortable if stored in a brassiere. Additionally, in light of this proliferation of newfound storage, manufacturers have started making and selling brassieres with pockets. However, these pockets only contribute to the habits of young women and do not to protect them from the potential dangers of cellphone related cancers.

Thus, there is a need for a garment that has a pocket or pockets configured to block various electromagnetic radiation. Preferably, the garment is a brassiere but maybe virtually any type of wearable garment. Such a pocket can provide a safe storage area for an electronic device with a diminished risk of adverse ailments based on the location of the storage. The present invention meets and exceeds these objectives.

Review of Related Technology:

U.S. Pat. No. 8,771,036 pertains to a bra having a pocket in a wing of the bra. The pocket may be made from the wing components or may be a separate structure. The pocket may comprise a closure, such as a zipper and may further comprise a high-tack material to prevent slipping of the bra when items are in the pocket.

U.S. Pat. No. 8,434,169 pertains to a shielding or protective garment in the form of women's clothing that includes an outer fashionable portion or component and an inner protective portion or component having electromagnetic radiation defeating material distributed throughout the inner component. The inner component is affixed within the outer component as a liner so as to extend around and over a portion of a wearer's torso and lower abdomen. The electromagnetic radiation defeating material of the inner component shields or protects the wearer from electromagnetic fields coming from any or all directions.

U.S. Pat. No. 5,882,242 pertains to a shielding brassiere fabricated of a soft supple material such as cotton interwoven with stainless steel threads to shield and screen the breast from electromagnetic radiation.

U.S. Patent Application 2013/0248064 pertains to a detachable, durable mini purse/storage pocket that provides a discreet and secure storage pouch for women to carry small items in their brassieres. The detachable storage pocket is designed for attaching outside of or inserting into the cup portion or cleavage area of a brassiere, and comprises a piece of material folded end-to-end to form a front panel and a back panel. The front panel and the back panel are secured together at their side edges to form a generally flat pocket having an open top. The detachable storage pocket further comprises a protective, flexible layer to block electronic ions or rays, and a perspiration liner to protect the storage pocket's contents from moisture, both secured within an interior of the storage pocket. Furthermore, the detachable storage pocket comprises an adjustable strap and/or a clip for securing the storage pocket on the exterior or interior of the brassiere.

U.S. Patent Application 2012/0304357 pertains to a garment top that includes a body fabric designed for covering a chest of a wearer, and a pocket assembly formed with the body fabric. The pocket assembly comprises a front and a back cooperating to form a pocket for holding an article proximate the chest of the wearer. The back of the pocket assembly incorporates a radiation barrier adapted for residing between the article and the wearer.

Various devices are known in the art. However, their structure and means of operation are substantially different from the present disclosure. The other inventions fail to solve all the problems taught by the present disclosure. There is no such garment or brassiere that has a pocket or pockets designed specifically to prevent or limit the exposure of a wearer to electromagnetic radiation from an electronic device stored therein. At least one embodiment of this invention is presented in the drawings below and will be described in more detail herein.

SUMMARY OF THE EMBODIMENTS

Generally, the present invention and its embodiments provide for a garment that has a pocket configured to shield a wearer from electromagnetic radiation. In one embodiment, the garment has at least one pocket with the at least one pocket being formed from or lined with the shielding material. The shielding material may be a metalized fabric and may be a silver plated fabric. In at least one embodiment, the silver plating is applied to a fabric blended from a polyamide and an elastomer.

In practice, the garment may take virtually any form including both those that traditional do and do not have pockets. For example, a shirt may have a pocket formed from the metalized threading. In turn, a brassiere, which typically do not have pockets, may have a pocket formed from the same or a similar material. The pocket may further have a closure mechanism to assist a wearer in retaining the objects held therein. The pockets may also be oriented in any number of fashions including but not limited to horizontal, vertical, and diagonal to conform to user preferences and the garment in question.

In one embodiment of the present invention there is a garment that shields a wearer from electromagnetic radiation, the garment having a length of fabric forming a wearable garment, wherein the length of fabric comprises a first fabric and a second fabric, the first fabric being a non-metalized fabric and the second fabric being a metalized fabric, wherein the metalized fabric is a metal plated fabric having one or more electrically conductive metals disposed thereon; and wherein the second fabric forms at least one pocket in the wearable garment.

In another embodiment of the present invention there is a garment that shields a wearer from electromagnetic radiation, the garment having a length of fabric forming a wearable garment; at least one pocketed area having at least a front side and a back side and defining an interior capable of receiving and retaining at least one item, the at least one pocketed area being coupled to the length of fabric, wherein the pocketed area comprises threading capable of preventing or reducing the passage of electromagnetic radiation therethrough.

In another aspect of the present invention there is a method of shielding a person from electromagnetic radiation, the method comprising: providing a garment comprising a length of fabric forming a wearable garment, wherein the length of fabric comprises a first fabric and a second fabric, the first fabric being a non-metalized fabric and the second fabric being a metalized fabric, wherein the metalized fabric is a metal plated fabric having one or more electrically conductive metals disposed thereon, wherein the second fabric forms at least one pocket in the wearable garment; and positioning the garment on a wearer wherein the at least one pocket is in an accessible area of the garment disposed on the arm, leg, or torso of the wearer.

In general, the present invention succeeds in conferring the following, and others not mentioned, benefits and objectives.

It is an object of the present invention to provide a garment that is lightweight and comfortable.

It is an object of the present invention to provide a garment that protects a wearer from electromagnetic radiation.

It is an object of the present invention to provide a garment that is capable of being hand or machine washable.

It is an object of the present invention to provide a garment that provides a pocket for the holding of objects such as electronic devices.

It is an object of the present invention to provide a garment that has a resealable pocket.

It is an object of the present invention to provide a garment that has at least one pocket formed from or lined with a metalized threading.

DESCRIPTION OF THE PREFERRED EMBODIMENTS

Figure 1:
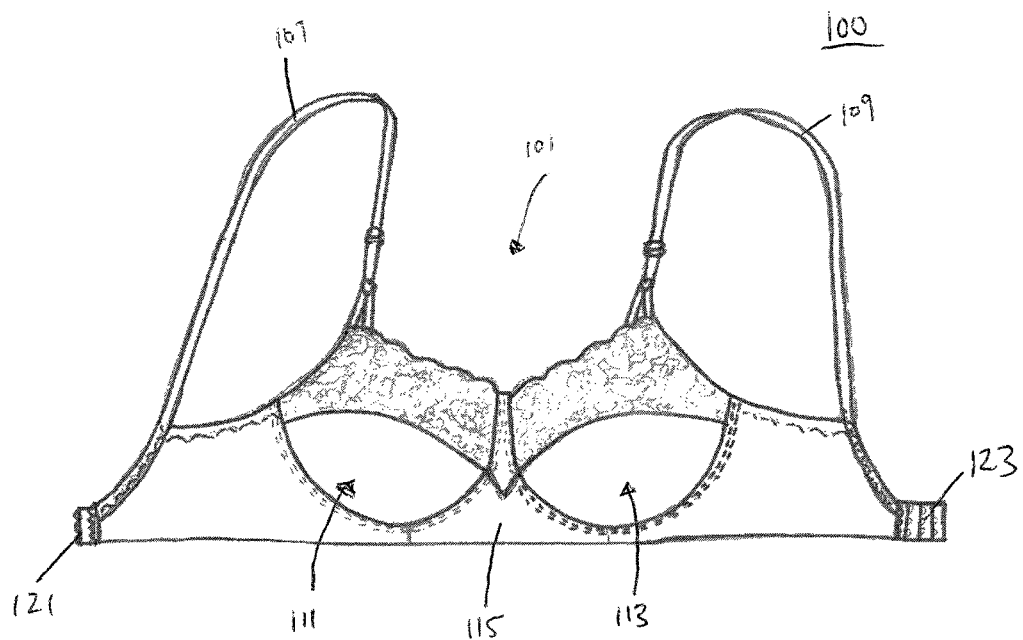
FIG. 1 is a front view of an embodiment of the present invention.

The preferred embodiments of the present invention will now be described with reference to the drawings. Identical elements in the various figures are identified with the same reference numerals.

Reference will now be made in detail to each embodiment of the present invention. Such embodiments are provided by way of explanation of the present invention, which is not intended to be limited thereto. In fact, those of ordinary skill in the art may appreciate upon reading the present specification and viewing the present drawings that various modifications and variations can be made thereto.

Figure 2:
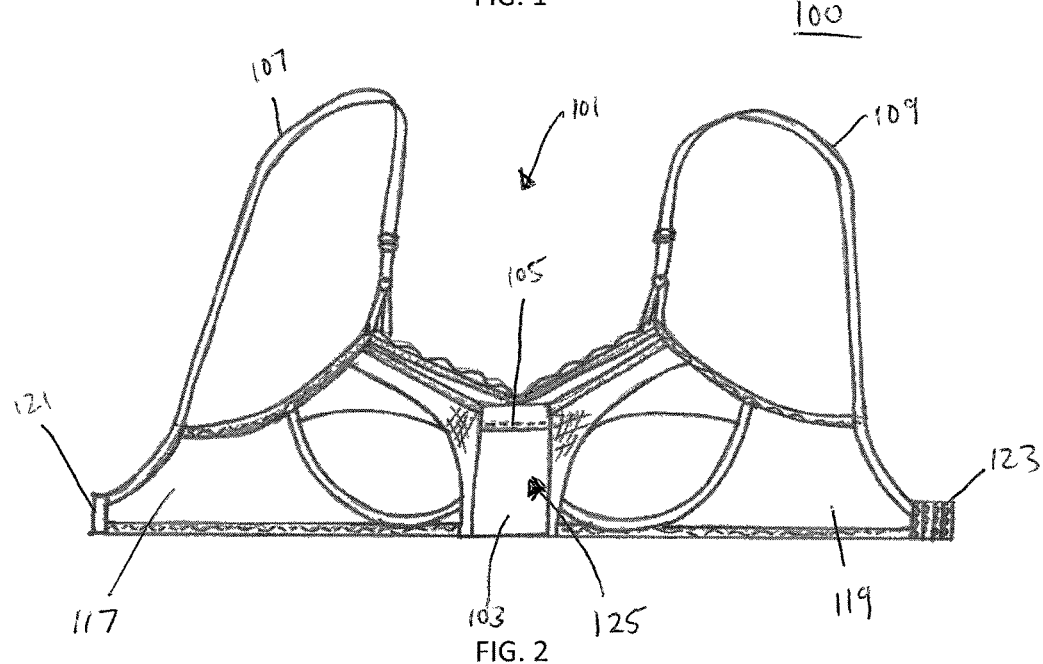
FIG. 2 is a back view of an embodiment of the present invention highlighting a pocketed area of the embodiment.
Figure 3:
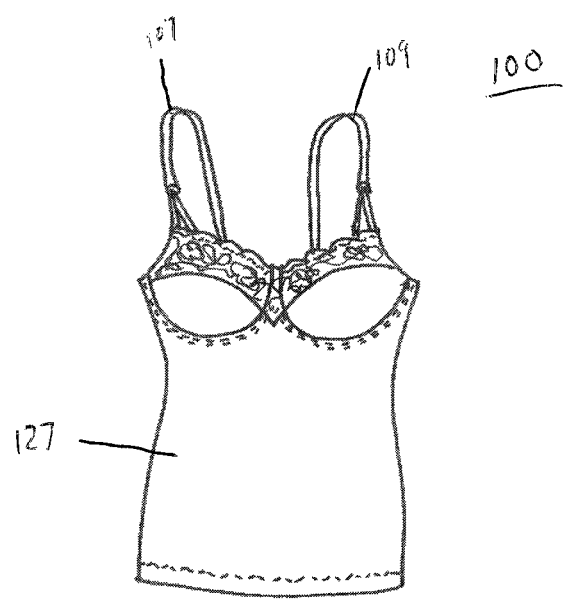
FIG. 3 is a front view of a second embodiment of the present invention.
Figure 4:
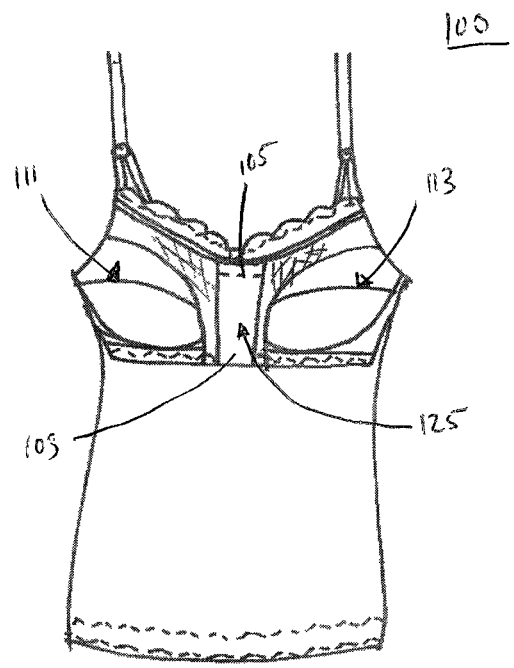
FIG. 4 is a back view of a second embodiment of the present invention highlighting a pocketed area of the embodiment.
Figure 7:
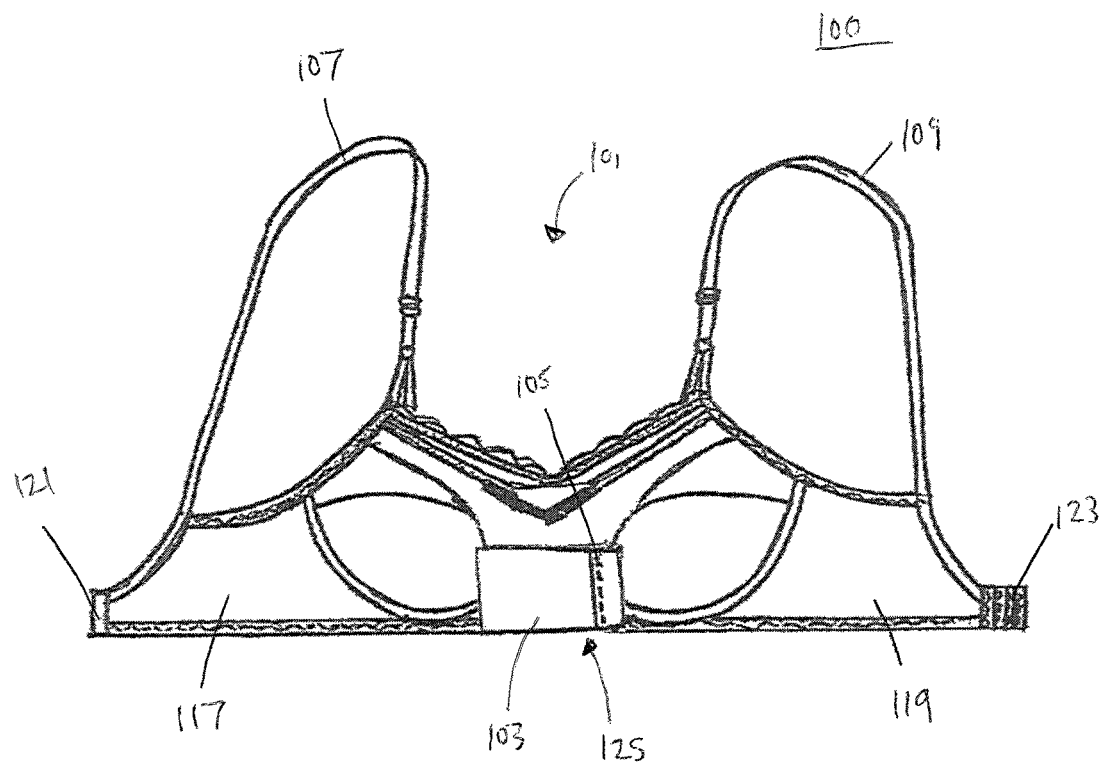
FIG. 7 is a back view of an embodiment of the present invention highlighting an alternate pocketed area of the embodiment.

Referring now to FIGS. 1-2 and 7, there is an embodiment of the present invention wherein the garment is a brassiere. The garment 100 generally comprises at least one first fabric 101 and a second fabric 125. The at least one first fabric 101 may be a single fabric or blend of fabrics comprising a singular material or differing materials comprising differing components of the garment 100. Suitable fabrics may include but are not limited to woven or unwoven fabrics, cloth, terrycloth, woven or woven fibers of wool, hemp, silk, flax, bamboo, cotton, and/or yarn, and synthetic textiles including but not limited to nylon, rayon, elastane, polyester, various polymer fibers, and/or acrylic, or any combinations thereof.

The second fabric 125 is preferably a metalized fabric that may include metallic fibers, metallic plated fibers, and fibers coated and/or impregnated with nano-sized metals (nanotextiles). Suitable metals may include but are not limited to copper, nickel, silver, gold, aluminum, iron, steel, brass, bronze, zinc, tungsten, platinum, chromium, titanium, molybdenum, manganese, or any combination thereof. The underlying or non-metallic components of the second fabric 125 may including those fabrics as described above and other fabrics not explicitly named herein. Further, in a preferred embodiment, the second fabric 125 is a silver plated fabric comprising about 40% to about 95% and more preferably 70% to about 90% of a polyamide and about 5% to about 50% and more preferably 10% to about 35% of an elastomer forming a fabric, with the fabric being plated in silver having a purity of about 50% to about 99% and more preferably about 90% to about 99%.

The second fabric 125 may have other properties including but not limited to a thickness of about 0.25 mm to about 1.00 mm and more preferably about 0.45 mm to about 0.55 mm. In a preferred embodiment, the thickness is about 0.50 mm and comprises 78% of a polyamide and 22% of an elastomer plated in 99% pure silver. The second fabric 125 may weigh about 155 g/m$^2$ and may be a knitted fabric having at least two stretch directions (e.g. wrap and weft). The second fabric 125 and its properties are preferably selected for its electromagnetic radiation shielding properties or electromagnetic interference.

The garment 100 or brassiere shown in FIGS. 1 and 2 comprises many of the components of a standard brassiere such as a first strap 107, second strap 109, first cup 111, second cup 113, a bridge member 115, first coupling section 117, second coupling section 119, a coupling mechanism 121, and a complementary coupling mechanism 123.

The garment 100 or brassiere further has a pocket 103. This pocket 103 is comprised of the second fabric 125 as opposed to the at least one first fabric 101 which comprises the remaining portions of the garment 100. This pocket 103 may be oriented, based upon a location of the opening or the dimensions of the pocket 103, in any fashion including vertically, horizontally, diagonally, or any angle located therebetween. For example, the pocket 103 in FIG. 7 has been turned about 90° and is generally horizontal with respect to the garment 100.

Figures 6A, 6B:
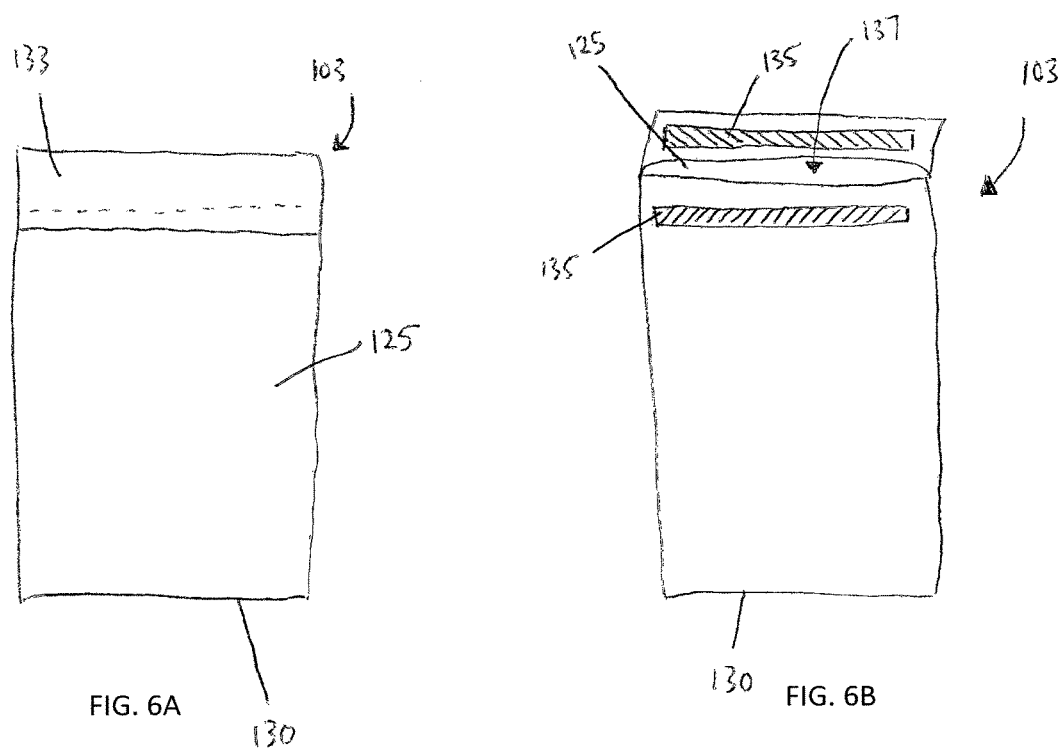
FIG. 6A is a front view of a pocket of the present invention.
FIG. 6B is a front view of an alternate pocket of the present invention.

Further, the pocket 103 may have varying forms such as those shown in FIGS. 6A and 6B. The pocket 103 may further have a closure mechanism 105 to selectively seal or open the pocket to thereby facilitate retainment or removal objects stored and/or placed within the pocket 103. The closure mechanism 105 may be located at any position on the pocket 103 and could comprise a length of any side of the pocket 103.

The pocket 103 preferably have a front piece forming a front side, a back piece forming a back side, and threading coupling the front piece to the back piece forming an interior located therebetween. The threading 130 (see FIG. 6A) is preferably of the same second fabric 125. The pocket 103 may be located between the cups of the brassiere or may be located in any other position on the brassiere including but not limited to the cups, coupling sections, or straps. There may be more than one pocket 103 per brassiere or other garment 100 on which the pocket 103 is present.

Figure 9:
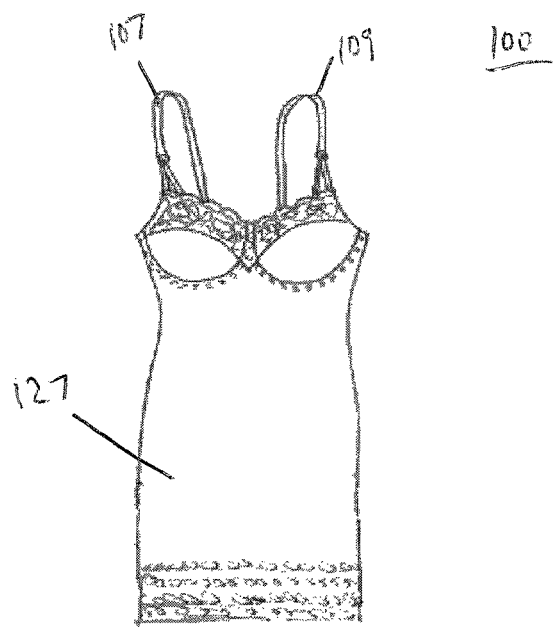
FIG. 9 is a front view of a fourth embodiment of the present invention.
Figure 10:
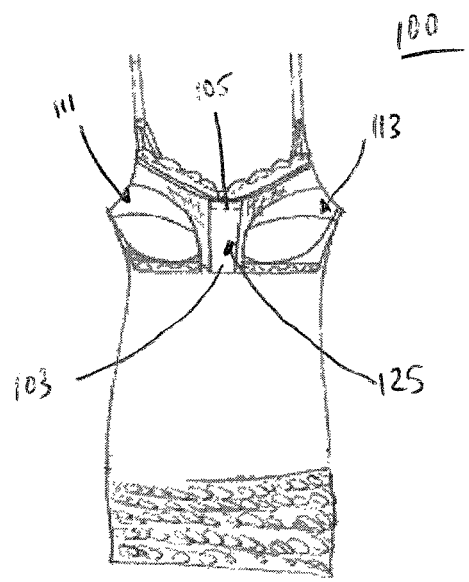
FIG. 10 is a back view of a fourth embodiment of the present invention highlighting a pocketed area of the embodiment.

Referring now to FIGS. 3-4 and 9-10, there is an alternative garment having the pocket 103, as described above, thereon. Here, the garment 100 is a camisole which may be either a half camisole (FIGS. 3 and 4) or a full length slip (FIGS. 9 and 10). The camisole generally has a first strap 107, second strap 109, first cup 111, second cup 113, and a length of material 127 being attached to the cups and straps the length of material having a varying length depending on the desired length of the camisole or full length slip. The length of material 127 comprises the at least one first fabric as described herein.

The pocket 103 is comprised of the second fabric 125 and has a closure mechanism 105 thereon. The pocket 103 may be located between the cups of the camisole or may be located in virtually any other position on the camisole including but not limited to the cups, straps, and along the length of material 127.

Figure 5:
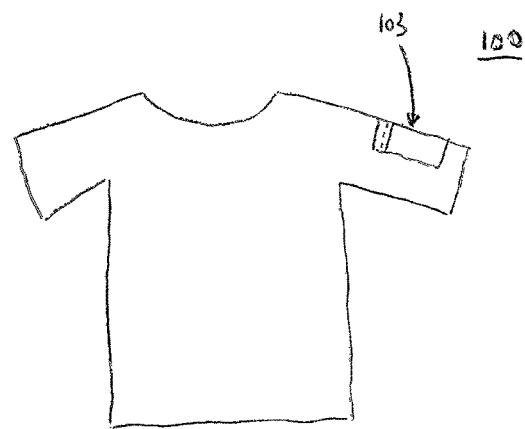
FIG. 5 is a front view of a third embodiment of the present invention.
Figure 8:
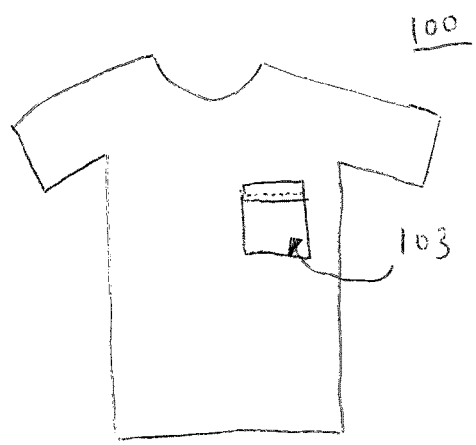
FIG. 8 is a front view of a third embodiment of the present invention having an alternatively positioned pocketed area.

Referring to FIGS. 5 and 8, there is an alternative garment with the pocket 103 as described. Here, the garment 100 is a shirt. The pocket 103 is positioned on a sleeve of the shirt, however, the pocket 103 may be positioned on a front or back of the shirt and may be located in virtually any location on the shirt. In some embodiments, the pocket 103 is located on an interior of the shirt. In FIG. 8, there is an alternative garment 100 with the pocket 103 in one alternate position.

As described in FIGS. 1-5 and 7-8, the garment 100 may be any number or types of garments including but not limited to brassieres, camisoles, slips, dresses, pants, jackets, sweaters, boxers, panties, hats, gloves, socks, leggings, suits, blouses, and the like or any combination thereof. In alternative embodiments, the present invention may be incorporated into other items such as handbags, purses, wallets, backpacks, and the like. The garment 100 may be designed for both men and women and include sizes for children. As noted above, the present technology may be incorporated into formal wear, casual wear, and active wear.

Referring now to FIGS. 6A and 6B, there are two embodiments of the pocket 103. These embodiments are intended to be illustrative only and other form factors may be contained under the purview of the present invention.

In FIG. 6A, the pocket 103 is comprised of a second fabric 125 as described above. The pocket 103 has a front side and a back side coupled with threading 130. The threading 130 may be the same or different as the second fabric 125. In a preferred embodiment, the threading 130 is comprised of the same fabric or a fabric exhibiting similar electromagnetic radiation shielding or electromagnetic interference properties. A flap 133 is positioned along one side of the pocket 103 providing a covering to the interior of the pocket 103. The flap 133 may be coupled to the front side and the back side of the pocket 103 in such a way that a top edge of the front side of the pocket 103 can be accessed to place the item in the pocket 103. The top edge is then tucked underneath the flap 133 and the flap 133 prevents the item from falling from the pocket 103.

In FIG. 6B, the pocket 103 has a similar construction to the pocket 103 shown in FIG. 6A save for the closure mechanism. Here, there is a flap having a closing mechanism 135 such as a hook and loop fastener. The flap can be lifted exposing the interior 137 of the pocket 103 and the item can then be placed therein. The flap is placed down and pressure from the flap itself or an outside force seals the closing mechanism 135.

The pocket 103 described in FIGS. 1-6B can be used to house a variety of items such as electronics (e.g. smart phones, tablets, music players, multimedia players, etc.), credit cards, debit cards, passports, and other items containing electronically readable and/or sensitive information. In addition to the security protection gained by containing such items within a pocket that limits or prevents the passage of electromagnetic radiation therethrough, a wearer can also be protected for health reasons.

Many users, as mentioned above, tend to store their electronic devices, especially cellular phones, in their pockets for hours and hours on end every day of the week. The health risks of exposing one's self to this type of constant electromagnetic radiation bombardment may result in unintended consequences to one's health. For example, it is not yet completely understood if and how electromagnetic radiation from cellular phones may lead to cancer. For those who store their phones in pockets near their groin area or in their brassiere, this is an unknown risk which can be completely avoided by implementing the present technology into their everyday clothing.

Although this invention has been described with a certain degree of particularity, it is to be understood that the present disclosure has been made only by way of illustration and that numerous changes in the details of construction and arrangement of parts may be resorted to without departing from the spirit and the scope of the invention.

What is claimed is:

1. A brassiere having a pocket that shields a wearer from electromagnetic radiation, the brassiere comprising:
    a strap assembly comprising a first strap and a second strap;
    a first cup and a second cup, the first cup being coupled to the second cup via a bridge member,
        wherein the first strap is coupled to an apex of the first cup and the second strap is coupled to an apex of the second cup;
    a first coupling section and a second coupling section, with the first coupling section having a coupling mechanism disposed on a first terminal end and the second coupling section having a complementary coupling mechanism on a second terminal end,
        wherein the first strap is further coupled to the first coupling section and the second strap is further coupled to the second coupling section;
    wherein the brassiere comprises at least one first fabric and a second fabric, the at least one first fabric being a non-metallized fabric and the second fabric being a metallized fabric,
        wherein the second fabric is a metal plated fabric having one or more electrically conductive metals disposed thereon; and
    wherein the second fabric forms at least one pocket in the brassiere;
    wherein the second fabric is configured to attenuate emission of electromagnetic radiation from the at least one pocket;
    wherein the at least one pocket is lined with the second fabric;
    wherein the second fabric comprises about 70% to about 90% of a polyamide and about 10% to about 35% of an elastomer forming a fabric, with the fabric being plated in silver, the silver having a purity of about 90% to about 99%.

2. The brassiere of claim 1 wherein the at least one pocket is positioned between the first cup and the second cup.

3. The brassiere of claim 1 wherein the at least one pocket is in the first coupling section or the second coupling section.

4. The brassiere of claim 1 further comprising a closure mechanism for selectively sealing an opening of the at least one pocket.

5. The brassiere of claim 4 wherein the closure mechanism closes the pocket horizontally.

6. The brassiere of claim 4 wherein the closure mechanism closes the pocket vertically.

7. A brassiere having a pocket that shields a wearer from electromagnetic radiation, the brassiere comprising:
    a strap assembly comprising a first strap and a second strap;
    a first cup and a second cup, the first cup being coupled to the second cup via a bridge member,
        wherein the first strap is coupled to an apex of the first cup and the second strap is coupled to an apex of the second cup;
    a first coupling section and a second coupling section, with the first coupling section having a coupling mechanism disposed on a first terminal end and the second coupling section having a complementary coupling mechanism on a second terminal end;
    wherein the brassiere comprises at least one first fabric and a second fabric, the at least one first fabric being a non-metallized fabric and the second fabric being a silver plated fabric,
        wherein the silver plated fabric comprises one or more electrically conductive metals disposed thereon with at least one of the electrically conductive metals being silver; and
    wherein the second fabric forms at least one pocket in the brassiere, the at least one pocket having a closure mechanism for selectively opening and sealing the at least one pocket;
    wherein the second fabric is configured to attenuate emission of electromagnetic radiation from the at least one pocket;
    wherein the at least one pocket is lined with the second fabric;
    wherein the second fabric comprises about 70% to about 90% of a polyamide and about 10% to about 35% of an elastomer forming a fabric, with the fabric being plated in silver, the silver having a purity of about 90% to about 99%.

8. The brassiere of claim 7 wherein the at least one pocket is oriented horizontally.

9. The brassiere of claim 7 wherein the at least one pocket is oriented horizontally.

* * * * *